United States Patent
Gupta et al.

(10) Patent No.: US 6,778,024 B2
(45) Date of Patent: Aug. 17, 2004

(54) DYNAMICALLY TRIMMED VOLTAGE CONTROLLED OSCILLATOR

(75) Inventors: Atul K. Gupta, Mississauga (CA); Wesley C. d'Haene, Burlington (CA); Bengt W. Littmann, Toronto (CA); Jason R. Miller, Burlington (CA)

(73) Assignee: Gennum Corporation (CA)

( * ) Notice: Subject to any disclaimer, the term of this patent is extended or adjusted under 35 U.S.C. 154(b) by 0 days.

(21) Appl. No.: 10/294,307

(22) Filed: Nov. 14, 2002

(65) Prior Publication Data

US 2004/0095194 A1 May 20, 2004

(51) Int. Cl.[7] .............................................. H03L 7/093
(52) U.S. Cl. ........................ 331/16; 331/1 A; 331/17
(58) Field of Search ............................ 331/16, 25, 14, 331/11, 1 A, 17, 36 C, 117 R, 179, 177 V; 327/160

(56) References Cited

U.S. PATENT DOCUMENTS

| | | |
|---|---|---|
| 4,726,022 A | 2/1988 | Chan et al. |
| 4,929,918 A | 5/1990 | Chung et al. |
| 5,625,325 A * | 4/1997 | Rotzoll et al. ................. 331/16 |
| 5,648,744 A * | 7/1997 | Prakash et al. ................ 331/11 |
| 5,686,864 A * | 11/1997 | Martin et al. ................ 331/1 A |
| 5,736,904 A | 4/1998 | Humphreys et al. |
| 5,942,949 A | 8/1999 | Wilson et al. |
| 6,091,304 A * | 7/2000 | Harrer .......................... 331/10 |
| 6,114,920 A * | 9/2000 | Moon et al. ................. 331/179 |
| 6,133,797 A | 10/2000 | Lovelace et al. |
| 6,172,579 B1 | 1/2001 | Dacus et al. |
| 2002/0033739 A1 | 3/2002 | Bisanti et al. |
| 2002/0033741 A1 | 3/2002 | Cranickx et al. |
| 2002/0075080 A1 | 6/2002 | Nelson et al. |

FOREIGN PATENT DOCUMENTS

| | | |
|---|---|---|
| EP | 0660611 A2 | 6/1995 |
| GB | 2120478 A | 11/1983 |

* cited by examiner

Primary Examiner—A Kinkead
Assistant Examiner—Joseph Chang
(74) Attorney, Agent, or Firm—Jones Day (57) ABSTRACT

A system for dynamically trimming a voltage controlled oscillator operable to receive a trim signal for adjusting a voltage-to-frequency operating characteristic of the voltage controlled oscillator and receive a tune signal to generate an output signal having an output frequency determined by the voltage-to-frequency operating characteristic includes a trim circuit operable to receive the tune signal and generate the trim signal and increment or decrement the trim signal and condition a change in the trim signal during the increment or decrement so that the voltage-to-frequency operating characteristic of the voltage controlled oscillator drifts from a first voltage-to-frequency operating characteristic to a second voltage-to-frequency operating characteristic.

42 Claims, 5 Drawing Sheets

DYNAMICALLY TRIMMED VOLTAGE CONTROLLED OSCILLATOR

BACKGROUND

1. Field of the Invention

The invention relates to oscillators, and more particularly to a system and method for dynamically trimming a voltage controlled oscillator (VCO).

2. Description of the Related Art

A VCO is a common circuit component, particularly in a phase locked loop (PLL). A PLL circuit includes a VCO that locks to an incoming reference signal. Generally, the center frequency of the VCO, the VCO gain, and the overall tuning range of the VCO is considered in the design of the PLL.

Implementing a VCO in an integrated circuit presents trimming design considerations since the center frequency of the VCO will vary from chip to chip due to the manufacturing process. A typical method of dealing with VCO variations is hard trimming, which utilizes a one-time programmable or selectable center frequency trimming circuit in the VCO. This allows the VCO center frequency to be brought closer to a target frequency. However, with hard trimming, the VCO can only be programmed or trimmed once, and thus the VCO is susceptible to center frequency drifting due to temperature changes, aging, and other effects. To compensate for such effects, the VCO gain is increased; however, this results in a higher sensitivity to noise.

Another method of dealing with VCO variations is soft trimming. Soft trimming utilizes a VCO operable to receive a trim signal and adjust a voltage-to-frequency operating characteristic in response to the trim signal, and thus the VCO is less susceptible to center frequency drifting due to temperature changes, aging, and other effects. However, with soft trimming, the circuit implementing the VCO usually trims during a non-operational state, e.g., a calibration state, or often suffers from temporary system degradation during soft trimming, e.g., the PLL may temporarily lose lock during the trimming adjustment.

SUMMARY

A system is provided for dynamically trimming a voltage controlled oscillator operable to receive a trim signal for adjusting a voltage-to-frequency operating characteristic of the voltage controlled oscillator and receive a tune signal to generate an output signal having an output frequency determined by the voltage-to-frequency operating characteristic. The system comprises a trim circuit operable to receive the tune signal and generate the trim signal in response to the tune signal and increment or decrement the trim signal and condition a change in the trim signal during the increment or decrement so that the voltage-to-frequency operating characteristic of the voltage controlled oscillator drifts from a first voltage-to-frequency operating characteristic to a second voltage-to-frequency operating characteristic at a rate less than a specified frequency rate.

A phase locked loop comprises a voltage controlled oscillator, a loop filter and a trim circuit. The voltage controlled oscillator is operable to receive a trim signal for adjusting a voltage-to-frequency operating characteristic of the voltage controlled oscillator, and receive a tune signal to generate an output signal having an output frequency determined by the voltage-to-frequency operating characteristic. The loop filter is operable to receive an error signal and generate the tune signal in response to the error signal. The trim circuit is operable to receive the tune signal and generate the trim signal and increment or decrement the trim signal and condition a change in the trim signal during the increment or decrement so that the voltage-to-frequency operating characteristic of the voltage controlled oscillator drifts from a first voltage-to-frequency operating characteristic to a second voltage-to-frequency operating characteristic at a rate at which the phase locked loop remains in a locked state.

A method of dynamically trimming a voltage controlled oscillator in a phase locked loop comprises the steps of determining if a voltage-to-frequency operating characteristic of the voltage controlled oscillator needs adjustment; generating a trim control signal to adjust the voltage-to-frequency operating characteristic of the voltage controlled oscillator upon a positive determination; and conditioning the generation of the trim control signal so that the rate of change of the voltage-to-frequency operating characteristic of the voltage controlled oscillator is controlled so that the phase locked loop remains in a locked state during adjustment of the voltage-to-frequency operating characteristic of the voltage controlled oscillator.

DETAILED DESCRIPTION

Throughout the drawings, the same or similar reference numerals are applied to the same or similar parts, elements and steps, and thus the description of the same or similar parts, elements and steps will be omitted or simplified when possible.

Figure 1:
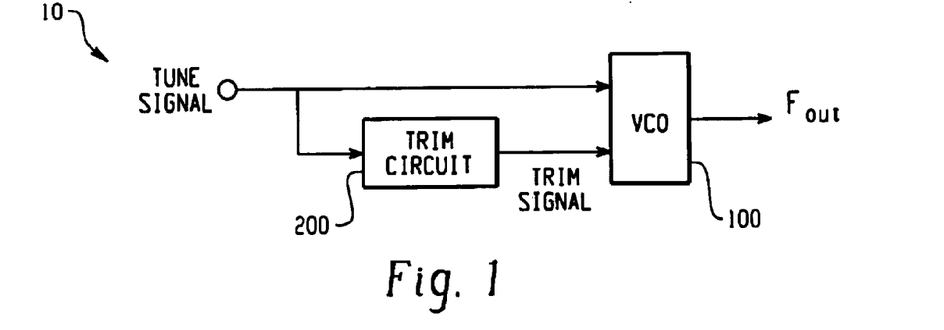
FIG. 1 is a block diagram of a system for dynamically trimming a VCO.

FIG. 1 provides a block diagram of a system 10 for dynamically trimming a VCO 100. The VCO 100 receives a trim signal for adjusting a voltage-to-frequency operating characteristic of the VCO 100, and also receives a tune signal to generate an output signal having an output frequency determined by the voltage-to-frequency operating characteristic.

The trim circuit 200 also receives the tune signal and generates the trim signal in response to the tune signal. Depending on the tune signal, the trim circuit 200 may increment or decrement the trim signal. The change in the trim signal during the increment or decrement is conditioned so that a change in the voltage-to-frequency operating characteristic of the VCO 100 does not exceed a frequency rate change.

In one embodiment, the system 10 is implemented in a PLL, and the frequency rate change is defined as a frequency rate tracking capability of the phase locked loop. In another embodiment, the frequency rate change is defined as a frequency rate proportional to a bandwidth of the phase locked loop. In yet another embodiment, the frequency rate change is defined as a frequency step proportional to a bandwidth of the phase locked loop. And in yet another embodiment, the frequency rate change is defined as a frequency rate at which the PLL may maintain a lock status during the change of the voltage-to-frequency operating characteristic of the VCO 100.

Figure 2:
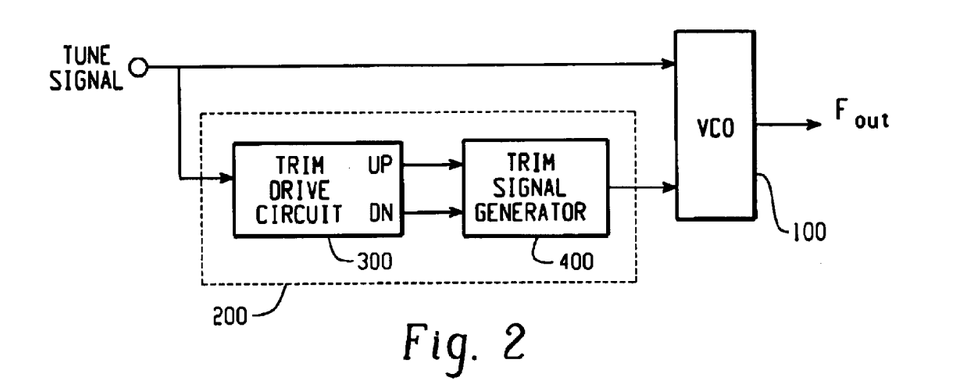
FIG. 2 is a more detailed block diagram of the system depicted in FIG. 1.

FIG. 2 proves a more detailed block diagram of the system 10 depicted in FIG. 1. The trim circuit 200 comprises a trim drive circuit 300 and a trim signal generator 400. The trim drive circuit 300 receives the tune signal and generates a trim increment signal (UP) or a trim decrement signal (DN) in response to the tune signal. The trim signal generator circuit 400 generates the trim signal and increments or decrements the trim signal in response to the trim increment signal and the trim decrement signal generated by the trim drive circuit 300. The trim signal generator 400 also conditions a change in the trim signal during the increment or decrement so that a change in the voltage-to-frequency operating characteristic of the VCO 100 does not exceed a frequency rate change.

Figure 3:
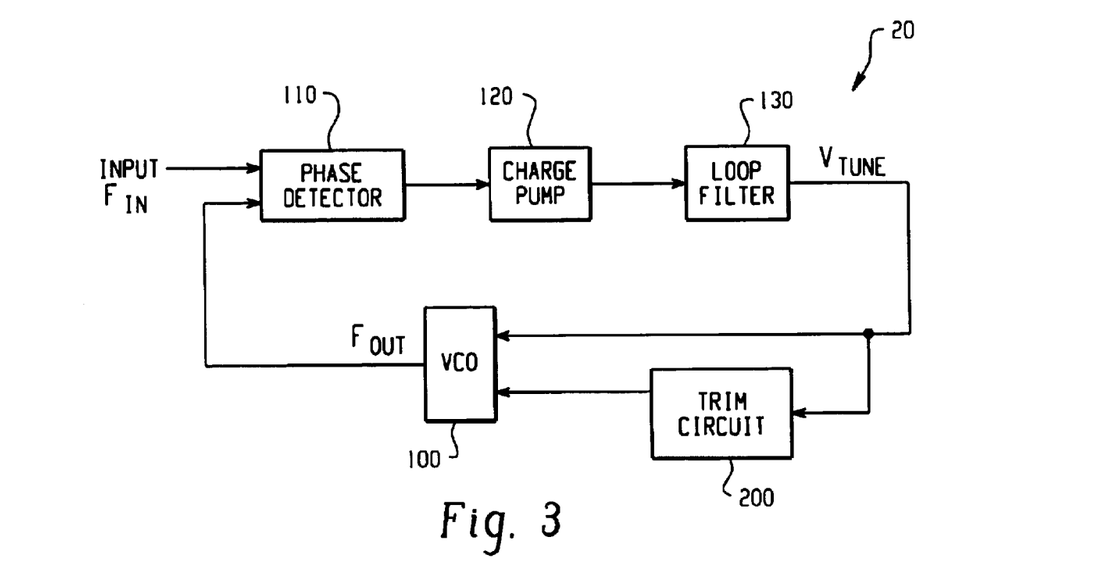
FIG. 3 is a block diagram of a PLL implementing the system for dynamically trimming a VCO.

FIG. 3 provides a block diagram of an illustrative PLL 20 implementing the system 10 for dynamically trimming the VCO 100. While this illustrative PLL 20 is described with reference to particular circuit components, other PLL implementations may also be used. The PLL 20 comprises the VCO 100, a phase detector 120, a charge pump 130, a loop filter 140, and the trim circuit 200. The phase detector 110 provides a phase difference between the input signal to the PLL 20 and the output signal of the VCO 100. The charge pump 120 charges or discharges the loop filter 130. The loop filter 130 provides the tune signal to the VCO 100 and the trim circuit 200. The tune signal is adjusted by the loop filter 130 to maintain lock such that the output frequency $F_{out}$ of the VCO 100 matches the input frequency $F_{in}$ of the input signal. The PLL 20 can track up to a certain frequency change rate of the input frequency $F_{in}$. The frequency change rate is determined by the particular phase detector 120, charge pump 130, and loop filter 140 selected.

The trim circuit 200 can select a number of settings to adjust the voltage-to-frequency operating characteristic of the VCO 100, and can adjust the voltage-to-frequency operating characteristic of the VCO 100 during operation of the PLL 20. This allows the VCO 100 center frequency to be trimmed dynamically, even when the PLL 20 is already locked. Furthermore, the PLL 20 implementing the trim circuit 200 exhibits lower sensitivity to noise compared to typical PLLs.

Figure 4:
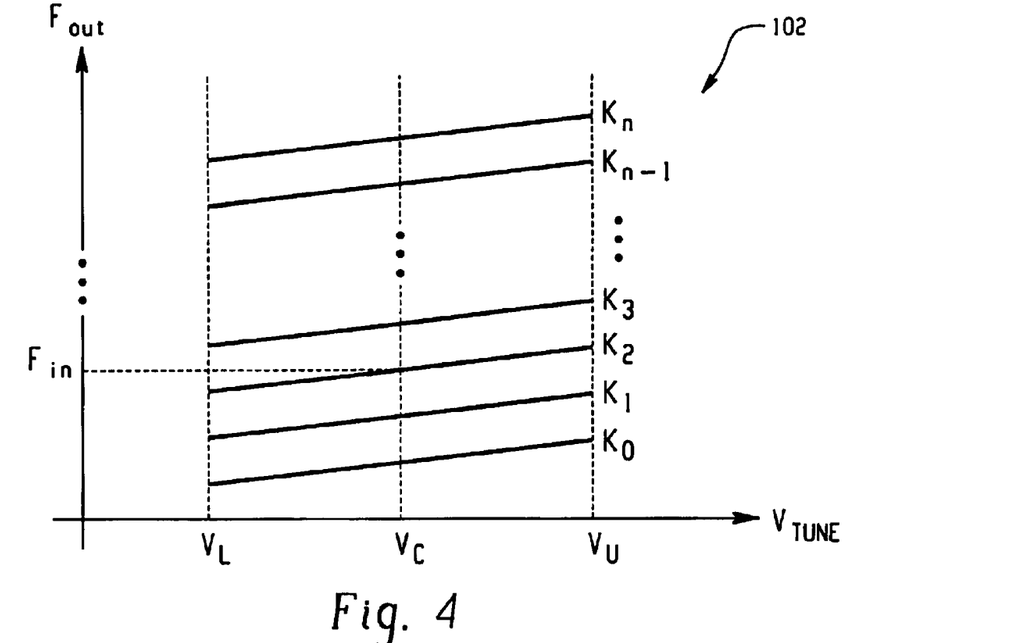
FIG. 4 is a graph of multiple voltage-to-frequency operating characteristics of a VCO.

FIG. 4 provides a graph 102 of multiple voltage-to-frequency operating characteristics of the VCO 100. The voltage-to-frequency gain K of the VCO 100 may be adjusted to one of a plurality of operating curves $K_{0...n}$ by the trim input signal. For each operating curve K, an input voltage $V_{tune}$, which is provided by the tune signal, generates a corresponding output frequency $F_{out}$. Each operating curve has a lower voltage limit $V_L$ and an upper voltage limit $V_U$ that defines an acceptable operational range for the input voltage $V_{tune}$. During ideal operation, the input voltage $V_{tune}$ is at or near the center voltage $V_c$ for a selected operating curve K.

Selection of a particular curve K depends on the application of the VCO 100. In the PLL 20, for example, the VCO 100 generates an output signal having a frequency $F_{out}$ that is to remain locked to an input reference signal. Assume initially that the PLL 20 is locked at an output frequency $F_{out}$ equal to $F_{in}$ when the tune signal is at $V_c$. Accordingly, curve $K_2$ is selected. During operation of the PLL 20, however, the voltage-to-frequency operating characteristic of the VCO 100 may change due to temperature, aging, and other conditions. Therefore, the transfer function of curve $K_2$ may shift up or down, which in turn will cause the tune signal voltage $V_{tune}$ to shift down or up to maintain lock. If the operating curve $K_2$ shifts far enough, the loop filter 130 will attempt to drive the tune signal $V_{tune}$ beyond an input limit $V_U$ or $V_L$.

When the tune signal exceeds one of the threshold voltages $V_U$ or $V_L$, the trim circuit 200 increments or decrements the trim signal. This in turn changes the voltage-to-frequency operating characteristic of the VCO 100 so that another curve K is selected. Furthermore, the trim signal is conditioned such that the PLL 20 will maintain lock on the input frequency $F_{in}$ during the change of the voltage-to-frequency operating characteristic. In one embodiment, the VCO 100 drifts from a current operating curve (e.g., $K_2$) to a newly selected operating curve (e.g., $K_3$) at a frequency rate such that the tune signal $V_{tune}$ may be adjusted by the loop filter 130 so that the PLL 20 remains locked during the transition.

The trim circuit 200 of the PLL 20 may also aid in acquiring lock on the input signal by incrementally selecting operating curves K and sweeping the tune signal to acquire a locked state. For example, during initialization of the PLL 20, the first curve $K_0$ may be selected to lock to the input frequency $F_{in}$. Upon failure to lock, the trim circuit 200 will select the next curve, $K_1$, and increment through the curves K until a locked state is acquired. As shown in FIG. 2, the PLL 20 eventually acquires a locked state on the curve $K_2$. Thereafter, the trim circuit 200 monitors the tune signal as previously described to determine whether to select another curve K. Accordingly, by dynamically trimming the VCO 100, the trim circuit 200 provides a PLL 20 with greater lock-in range and tracking range than conventional hard- or soft-trimming systems.

Figure 5:
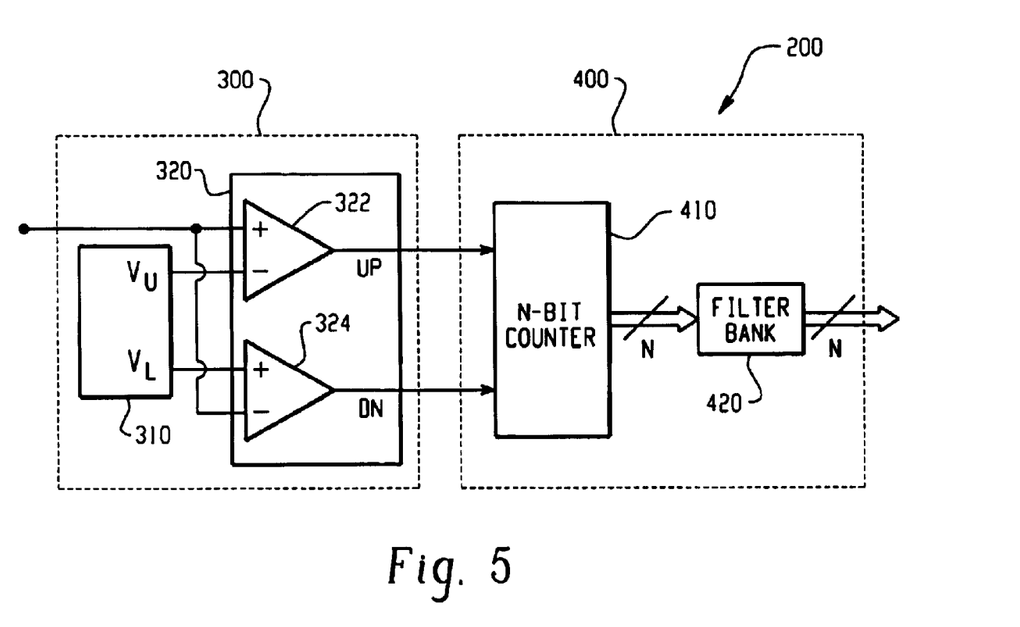
FIG. 5 is a block diagram of one embodiment of a trim circuit for dynamically trimming a VCO.

FIG. 5 provides a block diagram of one embodiment of the trim circuit 200 for dynamically trimming the VCO 100. The trim drive circuit 300 comprises a reference voltage generator 310 and a comparator block 320, and the trim signal generator 400 comprises an N-bit counter 410 and a filter bank 420.

The reference voltage generator 310 creates two reference voltages $V_U$ and $V_L$ that define a voltage range in which the VCO 100 is properly tunable. The comparator block 320 comprises a first comparator 322 and a second comparator 324. The reference voltages $V_U$ and $V_L$ are provided as input to the inverting input of the first comparator 322 and the noninverting input of the second comparator 324, respectively. Furthermore, the tune signal is provided as input to the noninverting input of the first comparator 322 and the inverting input of the second comparator 324, respectively. The output of the first comparator 322 is a trim increment signal (UP), and the output of the second comparator 324 is a trim decrement signal (DN). Thus, when the tune signal is greater than the reference voltage $V_U$, the trim increment signal goes high; likewise, when the tune signal is less than the reference voltage $V_L$, the trim decrement signal goes high.

The particular implementation of the trim drive circuit 300 is illustrative only; the trim drive circuit 300 may be realized by other implementations. For example, the tune signal may be provided to an analog-to-digital (A/D) converter to obtain a first digital value. The first digital value may then be compared to a high digital value and a low digital value to determine whether the tune signal is within acceptable limits. If the first digital value is not within acceptable limits, the corresponding increment or decrement signal is then generated. Other circuit implementations of the trim drive circuit may also be used.

The trim increment signal and the trim decrement signal are provided to the trim signal generator 400. The N-bit counter 410 produces an N-bit digital value. In one embodiment, only one bit of the N-bit digital value changes during an increment or decrement function. The digital value of the N-bit counter 410 is filtered through a filter bank 420. In one embodiment, the filter bank 420 comprises a plurality of low-pass filters each with a time constant $\tau$. The output of the filter bank 420 comprise trim bits that are provided as the trim signal input to the VCO 100.

The filter bank 420 causes the bits in the trim signal to change slowly in a quasi-static manner. For example, if the filter bank 420 comprises a plurality of single pole RC filters, then the bits in the trim signal will change according to the time constant $\tau = RC$. The quasi-static change prevents the trim bits input into the VCO 100 from switching on or off suddenly, thus preventing the frequency of the VCO 100 to likewise change suddenly. Such instantaneous frequency steps can result in the PLL 20 losing lock. However, when a trim bit is filtered through the filter bank 420, the filter switches the new trim bit slowly in a quasi-static manner, resulting in a drift of the voltage-to-frequency operating characteristic from a first curve $K_n$ to a second curve $K_{n \pm 1}$. The tune voltage $V_{tune}$ is simultaneously adjusted accordingly to maintain lock.

The value of the time constants is determined in part on the loop filter 130 response. Because the PLL 20 can track a certain rate of frequency change, the PLL 20 stays locked in the event of internal VCO frequency drift due to supply or temperature changes. The PLL 20 will remain locked as long as the internal rate of frequency change is slower than the frequency tracking capability of the PLL 20. The choice of the time constant $\tau$ and the loop filter 130 is also made in such a way to minimize the amount of phase error between the input and the output due to trimming while locked.

In another embodiment, the filter bank 420 is omitted. In this embodiment, the change in the trim bits will cause a frequency step to occur in the VCO 100. However, if the frequency step is small compared to the bandwidth of the PLL 20, then the PLL 20 can track the input signal during the change of the voltage-to-frequency operating characteristic.

The particular implementation of the trim signal generator 400 is illustrative only; the trim signal generator 400 may be realized by other implementations. For example, if the VCO 100 is operable to receive an analog trim signal, the trim signal generator 400 can provide an analog trim signal and condition the change of the analog trim signal such that the change in the voltage-to-frequency operating characteristic of the VCO 100 is not instantaneous.

Figure 6:
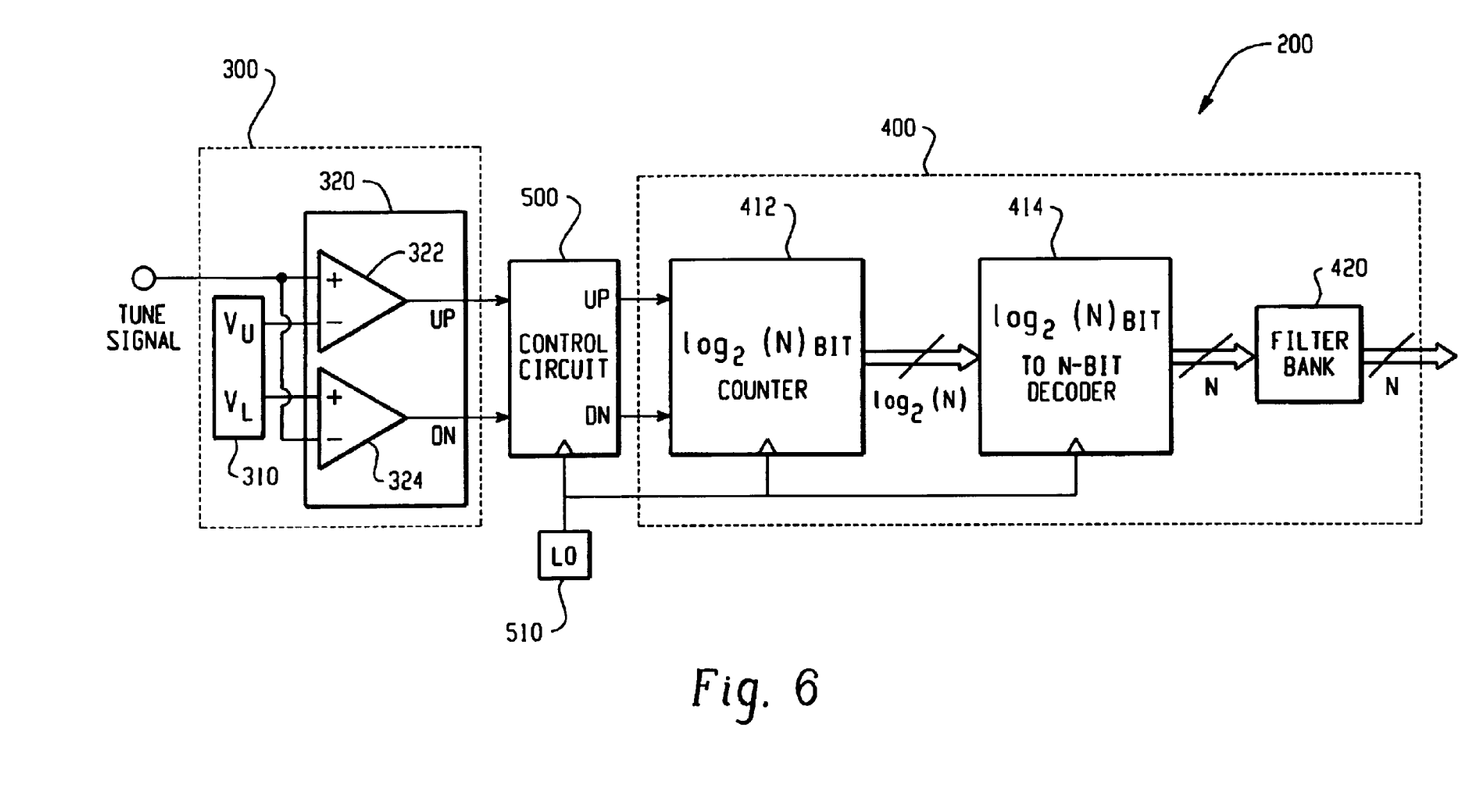
FIG. 6 is a block diagram of another embodiment of the trim circuit for dynamically trimming VCO.

FIG. 6 provides a block diagram of another embodiment of the trim circuit 200 for dynamically trimming VCO 100. The trim circuit 200 comprises a trim drive circuit 300, a trim signal generator 400, a control circuit 500, and a local oscillator (LO) 510.

In this embodiment, the trim signal generator 400 comprises a $\log_2(N)$-bit counter 412 that generates a $2^N$ binary number, and a $\log_2(N)$-to-N bit decoder 414 that receives the $2^N$ binary number and generates an N-bit digital value. The $\log_2(N)$bit counter 412 may be realized by a conventional binary counter that outputs a binary number, and the $\log_2(N)$-to-N bit decoder 414 may be realized by a conventional decoder that decodes a $\log_2(N)$ binary number (i.e., the $2^N$ binary number) into N bits. In one embodiment, the $\log_2(N)$-bit counter 412 is a 4-bit counter, and the $\log_2(N)$-to-N bit decoder 414 is a 4:16 bit decoder. The output of the $\log_2(N)$-to-N bit decoder 414 is provided to the filter bank 420 to select and change the trim settings on the VCO 100 as described above.

When the PLL 20 is locked, the control circuit 500 receives the trim increment signal and the trim decrement signal from the trim drive circuit 300 and generates a corresponding increment signal (UP) and a corresponding decrement signal (DN), respectively. The up signal and down signal cause the $\log_2(N)$-bit counter 412 to increment or decrement the $2^N$ binary number, respectively.

The control circuit 500 also aids the PLL 20 in acquiring lock on an input signal. When the PLL 20 is not locked, the control circuit 500 selects an acquisition mode and selectively adjusts the trim signal to adjust the voltage-to-frequency operating characteristic of the VCO 100 during the acquisition mode until the PLL 20 enters a locked state. For example, if the PLL 20 loses lock, or during initialization of the PLL 20, the first curve $K_0$ may be selected to lock to the input frequency $F_{in}$. Upon failure to lock, the control circuit 500 will select the next curve, $K_1$, and increment through the curves K until a locked state is acquired. As shown in FIG. 4, the PLL 20 eventually acquires a locked state on the curve $K_2$. Thereafter, the trim circuit 200 monitors the tune signal as previously described to determine whether to adjust the trim signal.

A local oscillator (LO) 510 provides a separate trim clock for the $\log_2(N)$-bit counter 412, the $\log_2(N)$-to-N bit decoder 414, and the control circuit 500. In one embodiment, the control circuit 500 comprises synchronous control logic and the LO 510 operates at a clock frequency less than the lowest VCO 100 output frequency. By driving the $\log_2(N)$-bit counter 412, the $\log_2(N)$-to-N bit decoder 414, and the control circuit 500 at a frequency lower than the lowest operating frequency of the VCO 100, the increment or decrement operations of the trim signal are of long enough duration to ensure that the PLL 20 has time to fully shift the VCO 100 to another voltage-to-frequency operating characteristic and determine whether the tune signal is within an acceptable range before the trim signal is changed again.

Other operating frequencies for the LO 510 may also be selected. In another embodiment, the LO 510 operates at a frequency within the frequency range of the PLL 20, or even at a frequency exceeding the frequency range of the PLL 20. In this embodiment, the control circuit 500 selectively enables and disables the UP and DN signals so that the $\log_2(N)$ bit counter 412 does not increment or decrement so quickly so as to exceed the closed loop response time of the PLL 20. Thus, the PLL 20 has time to fully shift the VCO 100 to another voltage-to-frequency operating characteristic and determine whether the tune signal is within an acceptable range before the trim signal is changed.

Thus, the control circuit 500 and the LO 510 provide added stability to the trim circuit 200 by incorporation of hysteresis in the auto-trim control system. The ranges of $V_L$, $V_U$, the frequency step each trim bit provides, and the tuning range of the VCO 100 are selected as described above to ensure that when the control circuit 500 determines to change the trim signal, the change will shift the voltage-to-frequency operating characteristic and thereby shift the VCO 100 tuning voltage between the $V_L$ and $V_U$ voltage limits in such a manner that the PLL 20 maintains a locked state. In this manner, oscillation or chattering between two VCO voltage-to-frequency operating characteristics is avoided.

Figure 7:
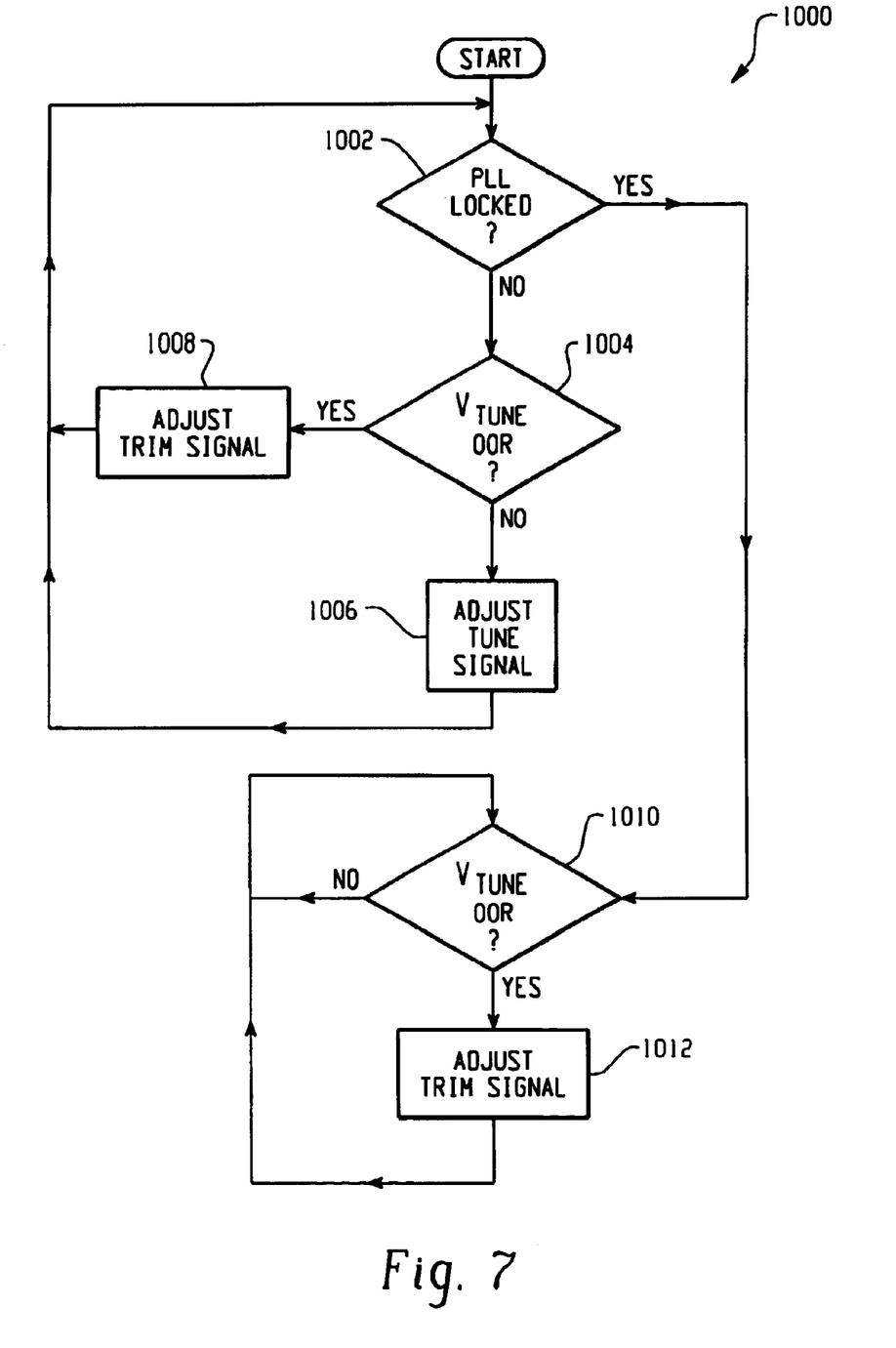
FIG. 7 is a flow chart illustrating one process of dynamically trimming the VCO of the PLL of FIG. 6.

FIG. 7 provides a flow chart 1000 illustrating one process of dynamically trimming the VCO 100 as implemented in FIG. 6, in a PLL 20. In step 1002, the control circuit 500 determines whether the PLL 20 is locked. If the PLL 20 is not locked, the control circuit 500 determines whether the tune signal voltage $V_{tune}$ is out of range (OOR) of the voltage range defined by the voltage values $V_L$ and $V_U$. If the tune signal voltage $V_{tune}$ is not out of range, the loop filter 130 adjusts the tune signal according to the closed-loop transfer function of the PLL 20, as shown in step 1006. Step 1002 is then repeated.

Returning to step 1004, if the tune signal voltage $V_{tune}$ is out of range, then the PLL 20 has failed to lock to the input signal for a selected operating curve K. Accordingly, the trim signal is adjusted either up or down, depending on whether the tune signal voltage $V_{tune}$ is less than $V_L$ or greater than $V_U$. Step 1002 is then repeated.

Once the PLL 20 acquires lock, then the tune drive circuit 300 continuously monitors whether the tune signal voltage $V_{tune}$ is out of range of the voltage range defined by the voltage values $V_L$ and $V_U$, as shown in step 1010. As long as the tune signal voltage $V_{tune}$ is within the voltage range defined by the voltage values $V_L$ and $V_U$, the trim signal remains the same. However, once the tune signal voltage $V_{tune}$ is out of the voltage range defined by the voltage values $V_L$ and $V_U$, then the trim signal is adjusted either up or down, depending on whether the tune signal voltage $V_{tune}$ is less than $V_L$ or greater than $V_U$. After the trim signal is adjusted, the voltage-to-frequency operating characteristic of the VCO 100 will change, as a new operating curve K has been selected. Step 1010 is then again executed, and thus adjustment of the trim signal continues until the tune signal voltage $V_{tune}$ returns to an acceptable voltage range.

Figure 8:
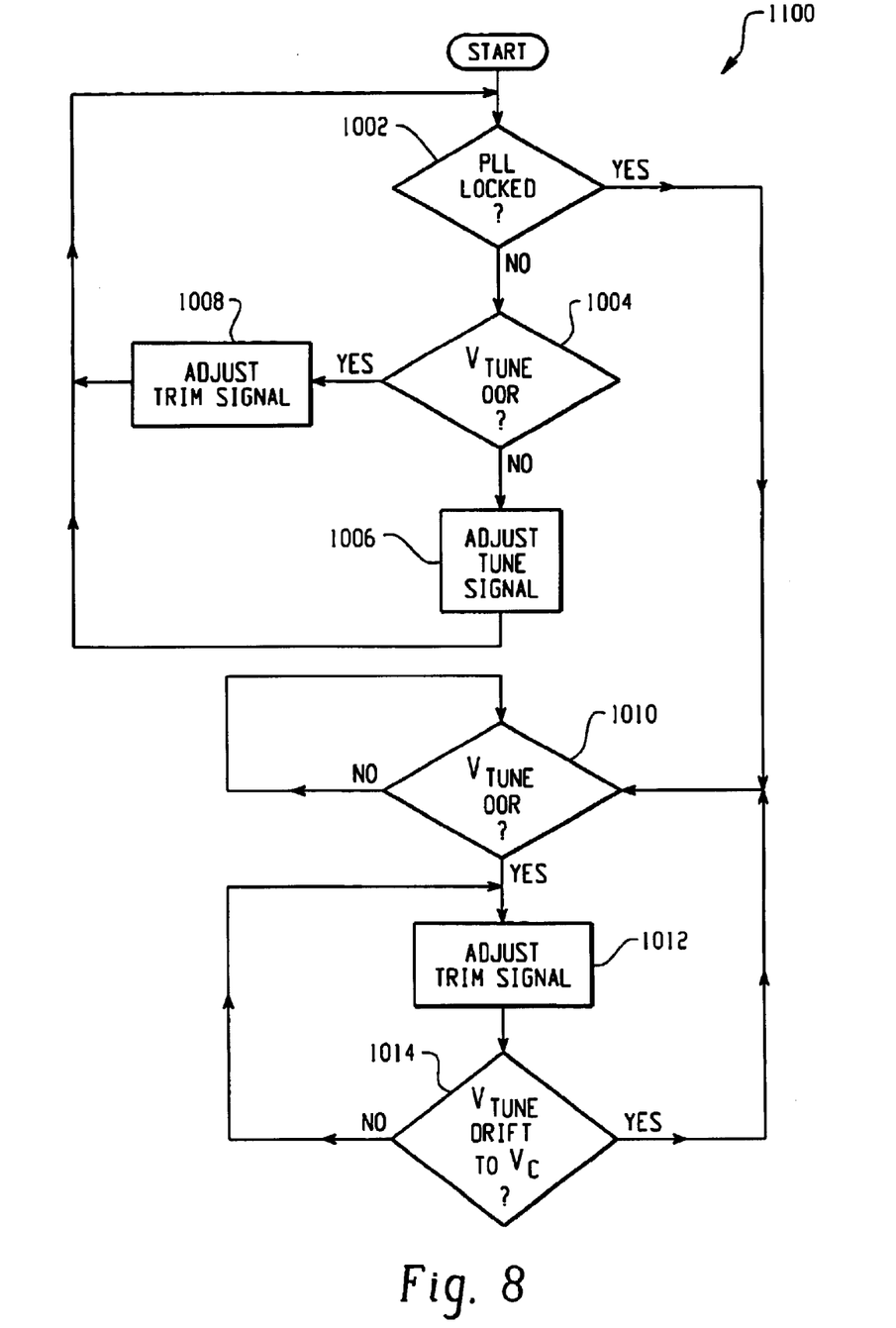
FIG. 8 is a flow chart illustrating another process of dynamically trimming the VCO of the PLL of FIG. 6.

FIG. 8 provides another flow chart 1100 illustrating another process of dynamically trimming the VCO 100 as implemented in FIG. 6, in a PLL 20. In this process, steps 1002, 1004, 1006, 1008, 1010, and 1012 of FIG. 7 are similarly executed. However, after step 1012, the trim circuit 200 determines whether the tune signal voltage $V_{tune}$ drifts to a center voltage of a newly selected operating curve K. If the tune signal voltage $V_{tune}$ drifts to a center voltage of a newly selected operating curve K, then the optimal operating curve K has been selected.

Conversely, if the tune signal voltage $V_{tune}$ does not drift near a center voltage of a newly selected operating curve K, then the optimal operating curve K has not been selected. Accordingly, steps 1012 and 1014 are repeated. Through repeated attempts, the operating curve K in which the tune signal voltage $V_{tune}$ drifts closest to the center voltage $V_c$ is eventually selected.

The process of selecting the optimal operating curve K may be realized by comparing a previous tune signal voltage values to a subsequent tune signal voltage values, and selecting the operating curve K in which a tune signal voltage value is closest to the center voltage $V_c$. Alternatively, the process of selecting the optimal operating curve K may be realized determining whether the tune signal voltage value is within an acceptable voltage margin centered around the center voltage $V_c$ and narrower than the range defined by $V_L$ and $V_U$. Other processes for selecting the optimal operating curve K can also be realized.

The processes of FIGS. 7 and 8 are illustrative only; other processes for dynamically adjusting the trim signal of a VCO 100 to acquire lock and to further maintain lock through such adjustments may also be realized. For example, a process step similar to step 1014 may also be implemented during the acquisition process of steps 1002–1008 to ensure that an optimal operating curve K is selected for an initial lock.

The embodiments described above are illustrative only. For example, while the embodiments are illustratively realized using discrete components, the trim circuit 200 may also be realized by using, for example, a programmable controller, or an Application Specific Integrated Circuit (ASIC), and the like. Other realizations of the particular functional blocks and corresponding operations, or combinations thereof, may also be used.

The embodiments described herein are examples of structures, systems or methods having elements corresponding to the elements of the invention recited in the claims. This written description may enable those of ordinary skill in the art to make and use embodiments having alternative elements that likewise correspond to the elements of the invention received in the claims. The intended scope of the invention thus includes other structures, systems or methods that do not differ from the literal language of the claims, and further includes other structures, systems or methods with insubstantial differences from the literal language of the claims.

What is claimed is:

1. A phase locked loop, comprising:

a voltage controlled oscillator operable to receive a trim signal for adjusting a voltage-to-frequency operating characteristic of the voltage controlled oscillator, and receive a tune signal to generate an output signal having an output frequency determined by the voltage-to-frequency operating characteristic;

a loop filter operable to receive an error signal and generate the tune signal in response to the error signal;

a trim drive circuit operable to receive the tune signal and generate a trim increment signal or a trim decrement signal in response to the tune signal; and a trim signal generator circuit operable to generate the trim signal and increment or decrement the trim signal in response to the trim increment signal or the trim decrement signal generated by the trim drive circuit;

wherein the phase locked loop remains in a locked state during the increment or the decrement of the trim signal.

2. The phase locked loop of claim 1, wherein the trim signal generator circuit comprises:

a $\log_2(N)$-bit counter operable to generate a $2^N$ binary number; and a $\log_2(N)$-to-N bit decoder operable to receive the $2^N$ binary number and generate an N-bit digital value;

wherein the trim signal comprises the N-bit digital value.

3. The phase locked loop of claim 2, wherein the trim signal generator circuit further comprises a filter bank operable to receive the N-bit digital value and filter each bit of the N-bit digital value.

4. The phase locked loop of claim 3, wherein the filter bank comprises a plurality of low pass filters so that each bit of the trim signal changes in a quasi-static manner.

5. The phase locked loop of claim 4, wherein a frequency rate adjustment of the voltage-to-frequency operating characteristic of the voltage controlled oscillator in response to a change in the trim signal is less than a frequency tracking capability of the phase locked loop.

6. The phase locked loop of claim 5, further comprising a trim clock operable to generate a trim clock signal for the $\log_2(N)$-bit counter and the $\log_2(N)$-to-N-bit decoder.

7. The phase locked loop of claim 6, where the trim drive circuit comprises:
   a reference voltage generator operable to generate a high reference voltage and a low reference voltage corresponding to a high voltage input limit and a low voltage input limit, respectively, of an adjusted voltage-to-frequency operating characteristic of the voltage controlled oscillator;
   a first comparator operable to receive the high reference voltage and the tune signal, and generate the trim increment signal if the tune signal is greater than the high reference voltage; and
   a second comparator operable to receive the low reference voltage and the tune signal, and generate the trim decrement signal if the tune signal is lower than the low reference voltage.

8. The phase locked loop of claim 6, further comprising a control circuit operable to receive the trim increment signal and the trim decrement signal and generate a corresponding up signal and a corresponding down signal, respectively, based on a locked state of the phase locked loop, the up signal and down signal causing the $\log_2(N)$-bit counter to increment or decrement the $2^N$ binary number, respectively.

9. The phase locked loop of claim 8, wherein the control circuit is further operable to select an acquisition mode and selectively adjust the trim signal to adjust the voltage-to-frequency operating characteristic of the voltage controlled oscillator during the acquisition mode until the phase locked loop enters a locked state.

10. The phase locked loop of claim 1, wherein the trim signal generator circuit comprises an N-bit counter operable to generate the N-bit digital value, and wherein the trim signal comprises the N-bit digital value.

11. The phase locked loop of claim 10, wherein a frequency rate adjustment of the voltage-to-frequency operating characteristic of the voltage controlled oscillator in response to a change in the trim signal is less than a frequency tracking capability of the phase locked loop.

12. The phase locked loop of claim 10, wherein the trim signal generator circuit further comprises a filter bank operable to receive the N-bit digital value and filter each bit of the N-bit digital value.

13. The phase locked loop of claim 12, wherein the filter bank comprises a plurality of low pass filters so that each bit of the trim signal changes in a quasi-static manner.

14. The phase locked loop of claim 13, wherein a frequency rate adjustment of the voltage-to-frequency operating characteristic of the voltage controlled oscillator in response to a change in the trim signal is less than a frequency tracking capability of the phase locked loop.

15. The phase locked loop of claim 10, wherein a resulting frequency change of the output signal of the voltage controlled oscillator in response to a change in the trim signal is less than a loop bandwidth of the phase locked loop.

16. The phase locked loop of claim 10, wherein the trim drive circuit comprises:
   a reference voltage generator operable to generate a high reference voltage and a low reference voltage corresponding to a high voltage input limit and a low voltage input limit, respectively, of an adjusted voltage-to-frequency operating characteristic of the voltage controlled oscillator;
   a first comparator operable to receive the high reference voltage and the tune signal, and generate the trim increment signal if the tune signal is greater than the high reference voltage; and
   a second comparator operable to receive the low reference voltage and the tune signal, and generate the trim decrement signal if the tune signal is lower than the low reference voltage.

17. The phase locked loop of claim 15, further comprising a control circuit operable to receive the trim increment signal and the trim decrement signal and generate a corresponding up signal to increment the N-bit counter and a corresponding down signal to decrement the N-bit counter, respectively, and select an acquisition mode and selectively adjust the trim signal to adjust the voltage-to-frequency operating characteristic of the voltage controlled oscillator during the acquisition mode until the phase locked loop enters a locked state.

18. A system for dynamically trimming a voltage controlled oscillator operable to receive a trim signal for adjusting a voltage-to-frequency operating characteristic of the voltage controlled oscillator and receive a tune signal to generate an output signal having an output frequency determined by the voltage-to-frequency operating characteristic, the system comprising:
   a trim drive circuit operable to receive the tune signal and generate a trim increment signal or a trim decrement signal in response to the tune signal received;
   a trim signal generator circuit operable to generate the trim signal and increment or decrement the trim signal in response to the trim increment signal and the trim decrement signal generated by the trim drive circuit and condition a change in the trim signal during the increment or decrement so that a change in the voltage-to-frequency operating characteristic of the voltage controlled oscillator does not exceed a frequency rate change.

19. The system of claim 18, wherein the voltage controlled oscillator is implemented in a phase locked loop, and the frequency rate change is less than a frequency rate tracking capability of the phase locked loop.

20. The system of claim 18, wherein the voltage controlled oscillator is implemented in a phase locked loop, and the frequency rate change is proportional to a bandwidth of the phase locked loop.

21. The system of claim 18, wherein the trim signal generator circuit comprises:
   a $\log_2(N)$-bit counter operable to generate a $2^N$ binary number; and
   a $\log_2(N)$-to-N bit decoder operable to receive the $2^N$ binary number and generate an N-bit digital value;
   wherein the trim signal comprises the N-bit digital value.

22. The system of claim 21, wherein the trim signal generator circuit further comprises a filter bank operable to receive the N-bit digital value and low pass filter each bit of the N-bit digital value.

23. The system of claim 22, further comprising a trim clock operable to generate a trim clock signal for the $\log_2(N)$-bit counter and the $\log_2(N)$-to-N-bit decoder.

24. The system of claim 23, where the trim drive circuit comprises:
   a reference voltage generator operable to generate a high reference voltage and a low reference voltage corresponding to a high voltage input limit and a low voltage input limit, respectively, of an adjusted voltage-to-frequency operating characteristic of the voltage controlled oscillator;

a first comparator operable to receive the high reference voltage and the tune signal, and generate the trim increment signal if the tune signal is greater than the high reference voltage; and a second comparator operable to receive the low reference voltage and the tune signal, and generate the trim decrement signal if the tune signal is lower than the low reference voltage.

25. The system of claim 18, wherein the trim signal generator circuit comprises an N-bit counter operable to generate the N-bit digital value, and wherein the trim signal comprises the N-bit digital value.

26. The system of claim 25, wherein the trim signal generator circuit further comprises a filter bank operable to receive the N-bit digital value and low pass filter each bit of the N-bit digital value.

27. A method of dynamically trimming a voltage controlled oscillator in a phase locked loop, the method comprising the steps of:

determining if a voltage-to-frequency operating characteristic of the voltage controlled oscillator needs adjustment;

upon a positive determination, generating a trim control signal to adjust the voltage-to-frequency operating characteristic of the voltage controlled oscillator; and conditioning the generation of the trim control signal so that the rate of change of the voltage-to-frequency operating characteristic of the voltage controlled oscillator is controlled so that the phase locked loop remains in a locked state during adjustment of the voltage-to-frequency operating characteristic of the voltage controlled oscillator.

28. The method of claim 27, wherein the step of generating a trim control signal to adjust the voltage-to-frequency operating characteristic of the voltage controlled oscillator comprises the step of generating an N-bit digital value.

29. The method of claim 28, wherein the step of conditioning the generation of the trim control signal so that the rate of change of the voltage-to-frequency operating characteristic of the voltage controlled oscillator is controlled so that the phase locked loop remains in a locked state during adjustment of the voltage-to-frequency operating characteristic of the voltage controlled oscillator comprises the steps of:

determining a frequency tracking capability of the phase locked loop; and changing each bit of the trim signal in a quasi-static manner so that the voltage-to-frequency operating characteristic of the voltage controlled oscillator drifts from a first voltage-to-frequency operating characteristic to a second voltage-to-frequency operating characteristic at a rate at which the phase locked loop remains in a locked state.

30. The method of claim 28, wherein the step of conditioning the generation of the trim control signal so that the rate of change of the voltage-to-frequency operating characteristic of the voltage controlled oscillator is controlled so that the phase locked loop remains in a locked state during adjustment of the voltage-to-frequency operating characteristic of the voltage controlled oscillator comprises the steps of:

determining a loop bandwidth of the phase locked loop;

determining an incremental shift of the voltage-to-frequency operating characteristic of the voltage controlled oscillator; and changing the trim control signal in increments or decrements so that the incremental shift of the voltage-to-frequency operating characteristic of the voltage controlled oscillator is less than the loop bandwidth of the phase locked loop.

31. A phase locked loop, comprising:

a voltage controlled oscillator operable to receive a trim signal for adjusting a voltage-to-frequency operating characteristic of the voltage controlled oscillator, and receive a tune signal to generate an output signal having an output frequency determined by the voltage-to-frequency operating characteristic;

a loop filter operable to receive an error signal and generate the tune signal in response to the error signal;

a trim drive circuit operable to receive the tune signal and generate a trim increment signal or a trim decrement signal in response to the tune signal; and a trim signal generator circuit operable to generate the trim signal and increment or decrement the trim signal in response to the trim increment signal and trim decrement signal generated by the trim drive circuit and condition a change in the trim signal during the increment or decrement so that a change in the voltage-to-frequency operating characteristic of the voltage controlled oscillator does not exceed a frequency rate change.

32. The phase locked loop of claim 31, wherein the frequency rate change is defined as a frequency rate less than a frequency tracking capability of the phase locked loop.

33. The phase locked loop of claim 31, wherein the frequency rate change is defined as a frequency rate proportional to a bandwidth of the phase locked loop.

34. The phase locked loop of claim 31, wherein the frequency rate change is defined as a frequency step proportional to a bandwidth of the phase locked loop.

35. The phase locked loop of claim 31, wherein the trim signal comprises digital data that is sequentially incremented or decremented, and wherein each sequential increment or decrement causes a corresponding increment or decrement in the voltage-to-frequency operating characteristic of the phase locked loop.

36. The phase locked loop of claim 35, wherein the digital data of the trim signal is low pass filtered so that the voltage-to-frequency operating characteristic of the voltage controlled oscillator drifts from a first voltage-to-frequency operating characteristic to a second voltage-to-frequency operating characteristic during the sequential increment or decrement.

37. A phase locked loop, comprising:

a voltage controlled oscillator operable to receive a trim signal for adjusting a voltage-to-frequency operating characteristic of the voltage controlled oscillator, and receive a tune signal to generate an output signal having an output frequency determined by the voltage-to-frequency operating characteristic;

a loop filter operable to receive an error signal and generate the tune signal in response to the error signal; and a trim circuit operable to receive the tune signal and generate the trim signal and increment or decrement the trim signal and condition a change in the trim signal during the increment or decrement so that the voltage-to-frequency operating characteristic of the voltage controlled oscillator drifts from a first voltage-to-frequency operating characteristic to a second voltage-to-frequency operating characteristic at a rate at which the phase locked loop remains in a locked state.

38. The phase locked loop of claim 37, wherein the trim circuit comprises:

a trim drive circuit operable to receive the tune signal and generate a trim increment signal or a trim decrement signal in response to the tune signal; and a trim signal generator circuit operable to generate the trim signal and increment or decrement the trim signal in response to the trim increment signal and trim decrement signal generated by the trim drive circuit; and a control circuit operable to receive the trim increment signal and the trim decrement signal and generate a corresponding up signal to increment the trim signal and a corresponding down signal to decrement the trim signal, respectively, and select an acquisition mode and selectively adjust the trim signal to adjust the voltage-to-frequency operating characteristic of the voltage controlled oscillator during the acquisition mode until the phase lock loop enters a locked state.

39. The phase locked loop of claim 38, wherein the trim signal generator comprises:

a digital counter operable to generate a digital value, and wherein the trim signal comprises the digital value; and a filter bank operable to receive the digital value and low pass filter each bit of the N-bit digital value.

40. A system for dynamically trimming a voltage controlled oscillator operable to receive a trim signal for adjusting a voltage-to-frequency operating characteristic of the voltage controlled oscillator and receive a tune signal to generate an output signal having an output frequency determined by the voltage-to-frequency operating characteristic, the system comprising a trim circuit operable to receive the tune signal and generate the trim signal in response to the tune signal and increment or decrement the trim signal and condition a change in the trim signal during the increment or decrement so that the voltage-to-frequency operating characteristic of the voltage controlled oscillator drifts from a first voltage-to-frequency operating characteristic to a second voltage-to-frequency operating characteristic at a rate less than a specified frequency rate.

41. The system of claim 40, wherein the voltage controlled oscillator is implemented in a phase locked loop, and the specified frequency rate is a frequency rate tracking capability of the phase locked loop.

42. The system of claim 41, wherein the trim circuit comprises:

a trim drive circuit operable to receive the tune signal and generate a trim increment signal or a trim decrement signal in response to the tune signal; and a trim signal generator circuit operable to generate the trim signal and increment or decrement the trim signal in response to the trim increment signal and trim decrement signal generated by the trim drive circuit; and a control circuit operable to receive the trim increment signal and the trim decrement signal and generate a corresponding up signal to increment the trim signal and a corresponding down signal to decrement the trim signal, respectively, and select an acquisition mode and selectively adjust the trim signal to adjust the voltage-to-frequency operating characteristic of the voltage controlled oscillator during the acquisition mode until the phase lock loop enters a locked state.

* * * * *